(12) United States Patent  (10) Patent No.: US 6,744,654 B2
Loughmiller  (45) Date of Patent: Jun. 1, 2004

(54) HIGH DENSITY DYNAMIC TERNARY-CAM MEMORY ARCHITECTURE

(75) Inventor: Daniel R. Loughmiller, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/224,452

(22) Filed: Aug. 21, 2002

(65) Prior Publication Data

US 2004/0037104 A1 Feb. 26, 2004

(51) Int. Cl.$^7$ .......................... G11C 15/04; G11C 11/24
(52) U.S. Cl. .................... 365/49; 365/149; 365/189.07
(58) Field of Search .................. 365/49, 149, 189.07

(56) References Cited

U.S. PATENT DOCUMENTS

| | | | |
|---|---|---|---|
| 5,319,589 A | | 6/1994 | Yamagata et al. |
| 5,949,696 A | * | 9/1999 | Threewitt .................... 365/49 |
| 6,256,216 B1 | | 7/2001 | Lien et al. |
| 6,259,280 B1 | | 7/2001 | Koelling |
| 6,266,263 B1 | | 7/2001 | Lien et al. |
| 6,310,880 B1 | * | 10/2001 | Waller ........................ 365/49 |
| 6,320,777 B1 | | 11/2001 | Lines et al. |
| 6,362,992 B1 | | 3/2002 | Cheng |
| 6,373,739 B1 | | 4/2002 | Lien et al. |
| 6,430,169 B1 | | 8/2002 | Harms et al. |
| 6,430,170 B1 | | 8/2002 | Saints et al. |
| 6,430,414 B1 | | 8/2002 | Sorokine et al. |
| 6,430,415 B1 | | 8/2002 | Agashe et al. |
| 6,512,685 B1 | * | 1/2003 | Lien et al. ..................... 365/49 |
| 6,584,003 B1 | * | 6/2003 | Kim et al. .................... 365/49 |

* cited by examiner

*Primary Examiner*—Son Mai
(74) *Attorney, Agent, or Firm*—Dickstein Shapiro Morin & Oshinsky, LLP (57) ABSTRACT

A ternary CAM memory device is disclosed which comprises a pair of complementary compare lines, a pair of complementary bit lines, and a unique four transistor two capacitor circuit.

29 Claims, 5 Drawing Sheets

| COMPARAND | 0 | 1 | 1 | |
|---|---|---|---|---|
| CAM WORD 0 | 0 | 1 | X | MATCH |
| CAM WORD 1 | X | 0 | 0 | NO MATCH |
| CAM WORD 2 | 1 | 0 | 1 | NO MATCH |

HIGH DENSITY DYNAMIC TERNARY-CAM MEMORY ARCHITECTURE

FIELD OF THE INVENTION

The invention relates generally to asemiconductor memory and more particularly to a DRAM CAM device that performs compare operations simultaneously with refresh operations.

BACKGROUND OF THE INVENTION

A content addressable memory (CAM) is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data being stored within a given memory location) against the entire list of pre-stored entries. As a result of their unique searching algorithm, CAM devices are frequently employed in network equipment, particularly routers and switches, computer systems and other devices that require rapid content searching.

In order to perform a memory search in the above-identified manner, CAMs are organized differently than other memory devices. For example, data is stored in a random access memory (RAM) in a particular location, called an address. During a memory search on a RAM, the user supplies the address and gets back the data stored in that address (location).

In a CAM, however, data is stored in locations in a somewhat random fashion. The locations can be selected by an address, or the data can be written into a first empty memory location. Once information is stored in a memory location, it is found doing a memory search by comparing every bit in any memory location with every bit of data in a comparand register circuit. When the content stored in the CAM memory location does not match the data placed in the comparand register, the CAM device returns a no match indication. When the content stored in the CAM memory location matches the data placed in the comparand register, the CAM device returns a match indication. In addition, the CAM returns the identification of the address location in which the matching data is stored. Thus, with a CAM, the user supplies the data and gets back an indication of an address where a matching data is stored in the memory.

Locally, CAMs perform an exclusive-NOR (XNOR) function, so that a match is indicated only if both the stored bit and the corresponding input bit are the same state. CAMs are designed so that any number or all of the memory locations may be simultaneously searched for a match with incoming data. In certain cases, data in more than a single location in the memory will match the input data, This condition of multiple simultaneous matches must be detected and reported. However, circuitry for detecting multiple matches in a CAM memory generally is large and complex, and grows exponentially with the number of data words in the memory. Also, switching time is impeded because of the parasitic capacitance associated with the complex logic. Thus, there is a need for a multiple match detector having increased switching speed, yet reduced circuit complexity.

BRIEF SUMMARY OF THE INVENTION

In one aspect, the invention provides a simplified DRAM CAM device having a pair of content capacitors for storing data corresponding to a ternary value of the memory cell; a pair of pass transistors each separately connected to one of the content capacitors and also connected to one of a pair of complementary bitlines, for reading, writing, and refreshing the memory cell; and a pair of logic transistors each separately connected to one of the complementary compare lines and one of the capacitors for performing a comparison of the data on the complementary compare lines with that on the capacitors.

In yet another aspect of the invention, the content capacitors are transistors configured as capacitors.

These and other features and advantages of the invention will be more clearly seen from the following detailed description of the invention which is provided in connection with the accompanying drawings.

DETAILED DESCRIPTION OF THE INVENTION

Figure 1:
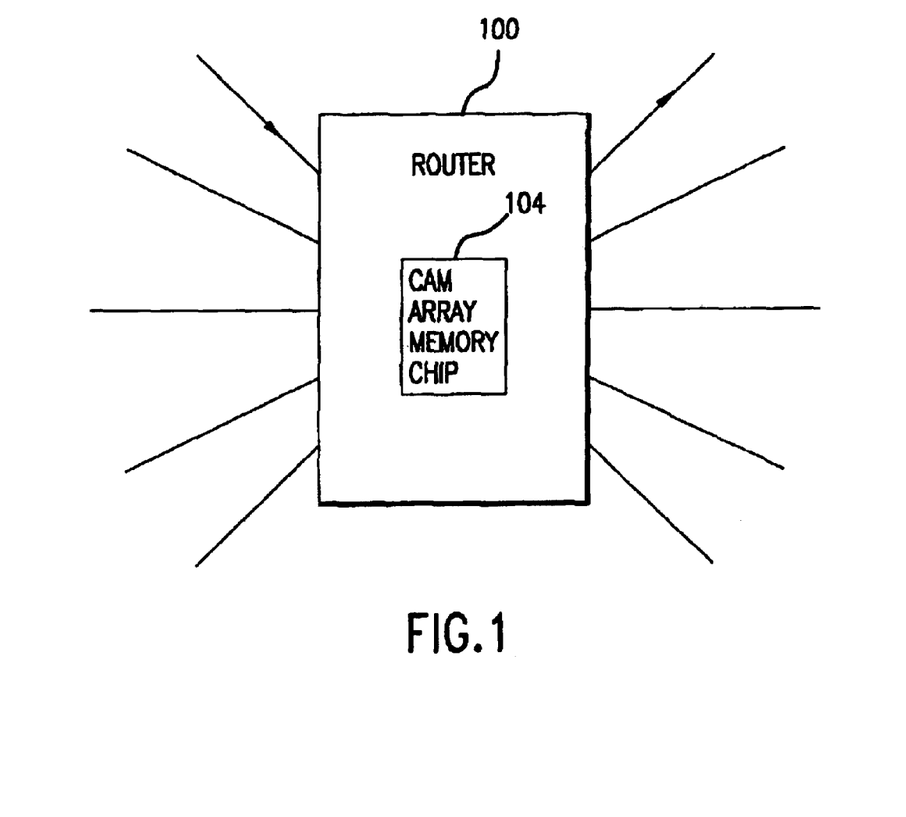
FIG. 1 is a block diagram of a CAM router.

FIG. 1 is a simplified block diagram of a router 100 containing a CAM array memory chip 104 as may be used in a communications network, such as, e.g., part of the Internet backbone. The router 100 contains a plurality of input lines and a plurality of output lines. When data is transmitted from one location to another, it is sent as a packet. Oftentimes, prior to the packet reaching its final destination, that packet is first received by a router, or some other device. The router 100 then decodes that part of the data identifying the ultimate destination and decides which output line and what forwarding instructions are required for the packet.

Generally, CAMs are very useful in router applications because of their ability for instantaneous search of a large database. As a result, when a packet is received by the router 100, the router already has the forwarding information stored within its CAM. Therefore, only that portion of the packet that identifies the sender and recipient need be decoded in order to perform a search of the CAM to identify which output line and instructions are required to pass the packet onto a next node of its journey.

Every dataword in a CAM has associated therewith a digital comparator which compares the data stored in that word with the data present at the input to the CAM, also known as a comparand. When the two words match, a match flag is generated. Conversely, the match signal is not generated in the absence of a match.

Figure 2:
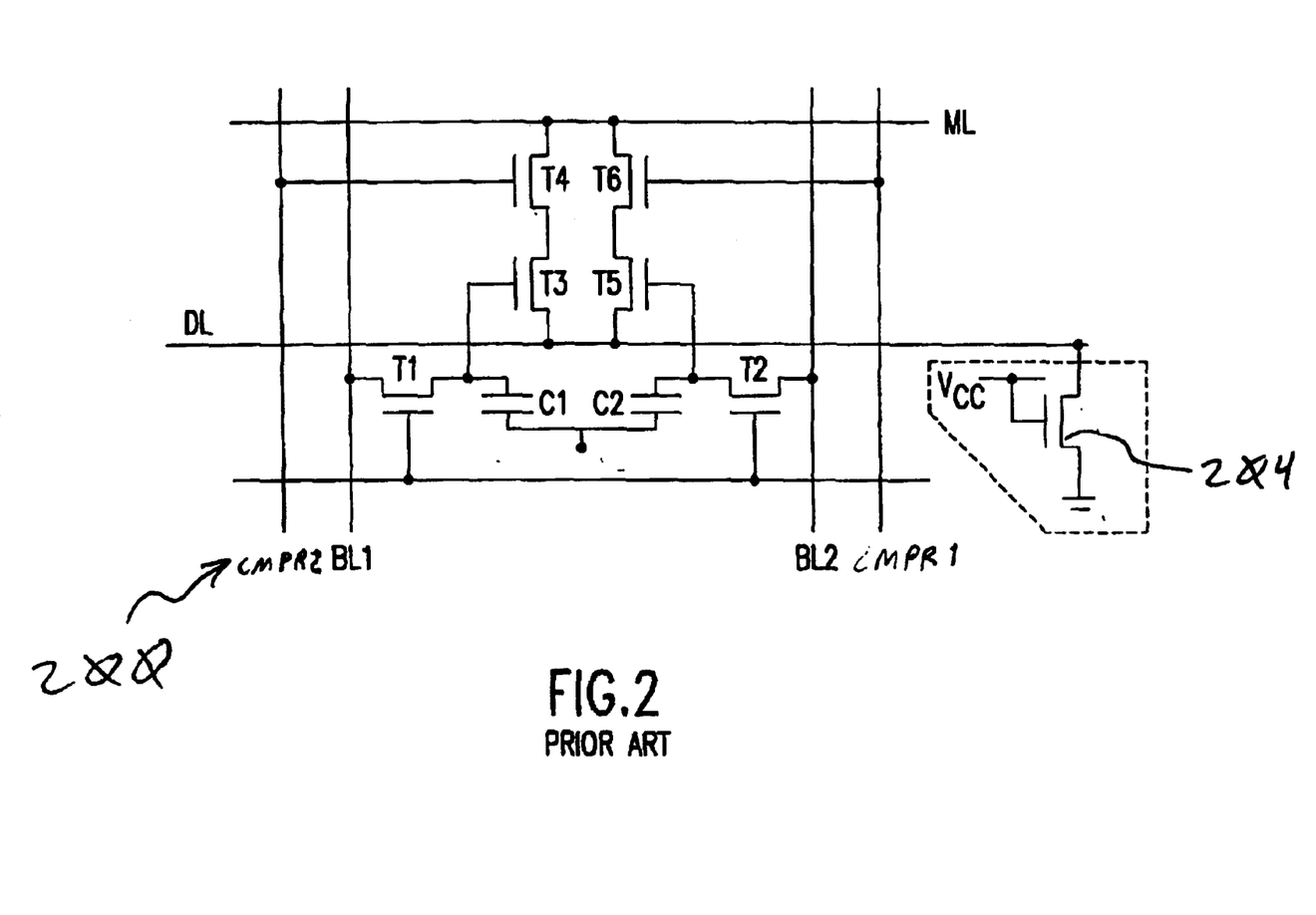
FIG. 2 is a schematic diagram of a prior art CAM memory cell.

As shown in FIG. 2, prior art DRAM based CAMs utilize a six transistor (T1–T6), two capacitor (C1–C2) per memory cell 200 arrangement. The prior art memory cell 200 has dual complementary bitlines BL1, BL2 and compare lines CMPR1, CMPR2. A discharge line DL is necessary for periodically discharging the match line ML through either of the serially connected transistors T3, T4 or T5, T6. To prevent a possible false route to ground, a ground line transistor 204 is connected to the discharge line DL.

Figure 3:
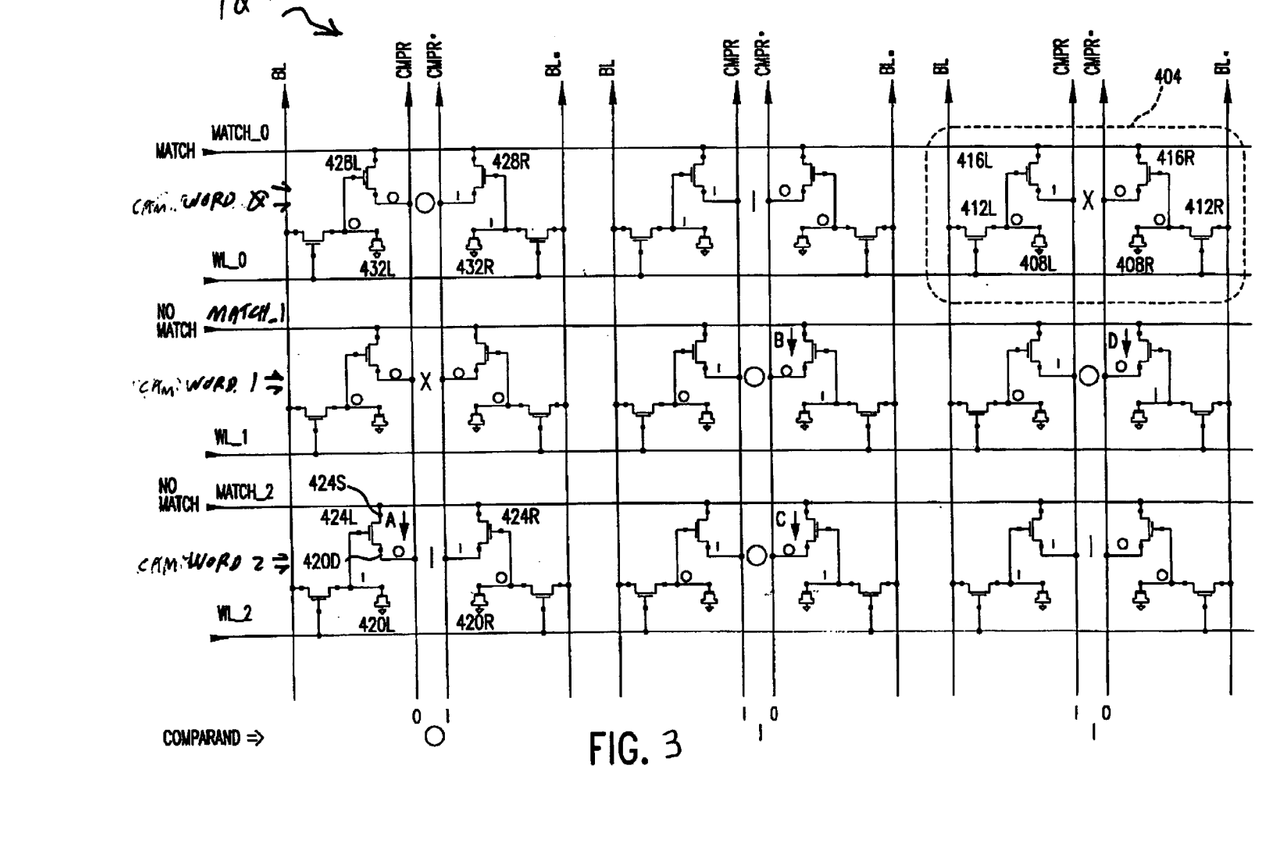
FIG. 3 is a schematic diagram of an array of CAM memory cells of the present invention.

The present invention, conversely, employs only four transistors and two capacitors, as shown by the example memory cell 404 in the portion of a CAM array depicted in FIG. 3. No discharge line or ground line transistor is necessary as the compare (CMPR and CMPR*) lines are used to discharge the match lines MATCH_0, MATCH_1, and MATCH_2.

Figure 4:
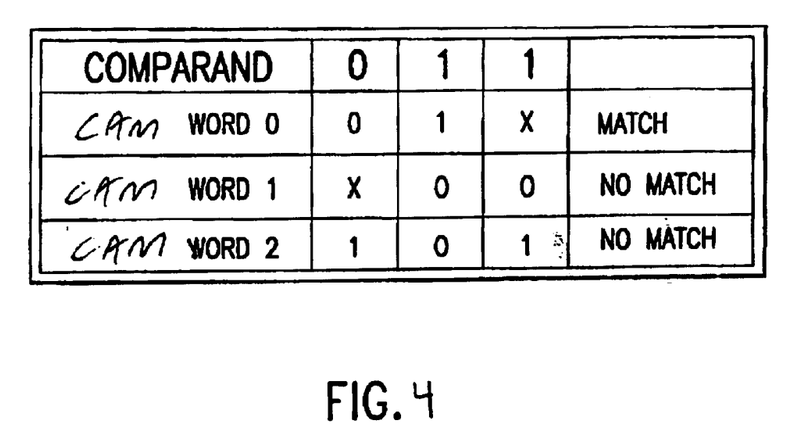
FIG. 4 is table of outputs resulting from a comparison made using the CAM memory device of the present invention.

FIG. 3 shows a total of nine individual CAM cells in the illustrated portion of the CAM memory array 104. Using the unit cell 404 as an example, FIG. 4 shows that each individual cell of the memory array 104 has two capacitors 408L, 408R, two pass transistors 412L, 412R, and two logic transistors 416L, 416R. Each memory cell holds one binary bit of data, where that bit is stored in complementary fashion within the two content capacitors 408L, 408R The content capacitors 408L, 408R are drawn as transistors behaving as capacitors, although traditional capacitors could be used as well. If the content capacitors 408L, 408R hold a '0' and '1', respectively, the memory cell 404 holds a binary '0'. Similarly, if the content capacitors 408L, 408R hold a '1' and '0' respectively, the memory cell 404 holds a binary '1'. Finally, if the content capacitors 408L, 408R both store a '0', the memory cell 404 holds a value of 'Don't Care'. A situation where both content capacitors 408L, 408R are simultaneously fully charged is not desired nor required to practice the present invention.

FIG. 4 is a table illustrating an exemplary set of comparison results using a ternary CAM device, which can store either 0's, 1's, or X's (Don't Cares). In FIG. 4, the values of the 3-bit CAM words 0, 1, and 2 are the same values which can be stored in the memory cells of FIG. 3. For brevity, the memory words in the example illustrated in FIG. 4 are 3 bits in length, although the present invention is not limited thereto To perform a CAM lookup, the data to be compared (the comparand) is delivered to the CAM device. A bitwise comparison is then performed and if a match is found on all bits, a "match" signal is asserted. As shown in FIG. 4, memory word 1 fails to result in a match because its second and third bits do not match with the comparand's second and third bits. Similarly, memory word 2 fails to result in a match because its first and second bits do not match with the comparand's first and second bits. Memory word 0 results in a match because its first and second bits match with the comparand's first and second bits. It is significant that a match still occurs even though the third bit of memory word 0 is a Don't Care.

Returning to FIG. 3, the two pass transistors 412L, 412R are used to read, write, and refresh the memory cell 404, and are respectively connected between the capacitors 408L and 408R and the bitlines Bl, BL* and the sets of transistors 408L and 408R are controlled by a word line WL_0. The two logic transistors 416L, 416R are used to logically compare the contents of the memory cell with data on the compare lines CMPR and CMPR*. The gates of transistor 416L, 416R are respectively connected to the capacitors 408 L and 408R while the source/drain regions of each are coupled between the match line MATCH_0 and a respective one of the compare lines CMPR, CMPR*.

When a compare operation is being performed, the value contained within each bit of the comparand (shown at the bottom of FIG. 3) is sent along the pair of complementary compare lines CMPR/CMPR*. As can be seen from the bottom of FIG. 3, for binary '0' the compare lines CMPR/CMPR* are set to 0/1, while for binary '1' are set to 1/0. The contents of the compare lines (1, 0, or 0,1) are shown in each memory cell in a smaller font, while the larger font in the middle of the memory cell shows the actual contents of this memory cell itself (1, 0, X (don't care)). An active-high match line MATCH_0, MATCH_1, MATCH_2 for each of the CAM words 0 (top), 1 (middle), and 2 (bottom) is precharged to Vcc. If a set of logic transistors, e.g. 416L, 416R connected to compare lines CMPR/CMPR* detects a non-match between the comparand and one bit of the CAM data word, meaning that one of the channel transistors 416L, 416R has a positive voltage on its gate, i.e., a "1" logic value and a "0" logic value as its associated compare line CMPR/CMPR*, a conduction path will exist for current to travel from the match lines, e.g., MATCH_0 to ground through one of the transistors 416L, 416R and associated compare line as shown by the arrows A, B, C, and D (FIG. 3), so that the match line associated with that CAM word will be pulled to ground and no longer precharged to Vcc. This indicates a no match condition. However, if all bits of a CAM word match the comparand, no conduction path exists and the match line remains at Vcc indicating a match condition.

Using the leftmost bit of the CAM word 2 (bottom of FIG. 3) as an example, the comparand holds a '0' in its leftmost bit. The leftmost bit of the stored word 2 is a '1'. Therefore, a mismatch exists and the MATCH_2 line is pulled to ground by transistor 424L turning on. If a '1' appeared at the leftmost CMPR line connected to the drain of the transistor 424L, the transistor 424L would remain off and the match line would remain in a high, "1", state.

Each bit of a data word stored in the CAM memory array is thus compared with a bit on a respective compare line. If there is a data mismatch, one of the transistors e.g. 416L, 416R of a bit will have a "1" at its gate and a "0" at its compare line thus pulling the match line to ground. Thus, if any one of the bits of the stored word does not match the bit on the corresponding compare line, a data mismatch is indicated for the entire word. The data stored in the CAM memory cells is loaded by turning on the access transistors e.g. 412L, 412R with the associated word line, e.g. WL_0, while supplying the data to be stored to the cell bitlines BL, BL*.

Because separate complementary bitlines (BL and BL*) and compare lines (CMPR/CMPR*) are used, stored data within capacitor 408L, 408R can be read out by the bitlines BL, BL*, by turning on the access transistors 412L, 412R with the associated word lines. Since separate compare and bitlines are provided, simultaneous refresh and compare operations can occur.

Because separate complementary bitlines (BL and BL*) and compare lines (CMPR/CMPR*) are used, stored data within capacitor 408L, 408R can be read out by the bit lines BL, BL*, by turning on the access transistors 412L, 412R with the associated word lines. Since separate compare and bit lines are provided, simultaneous refresh and compare operations can occur.

Figure 5:
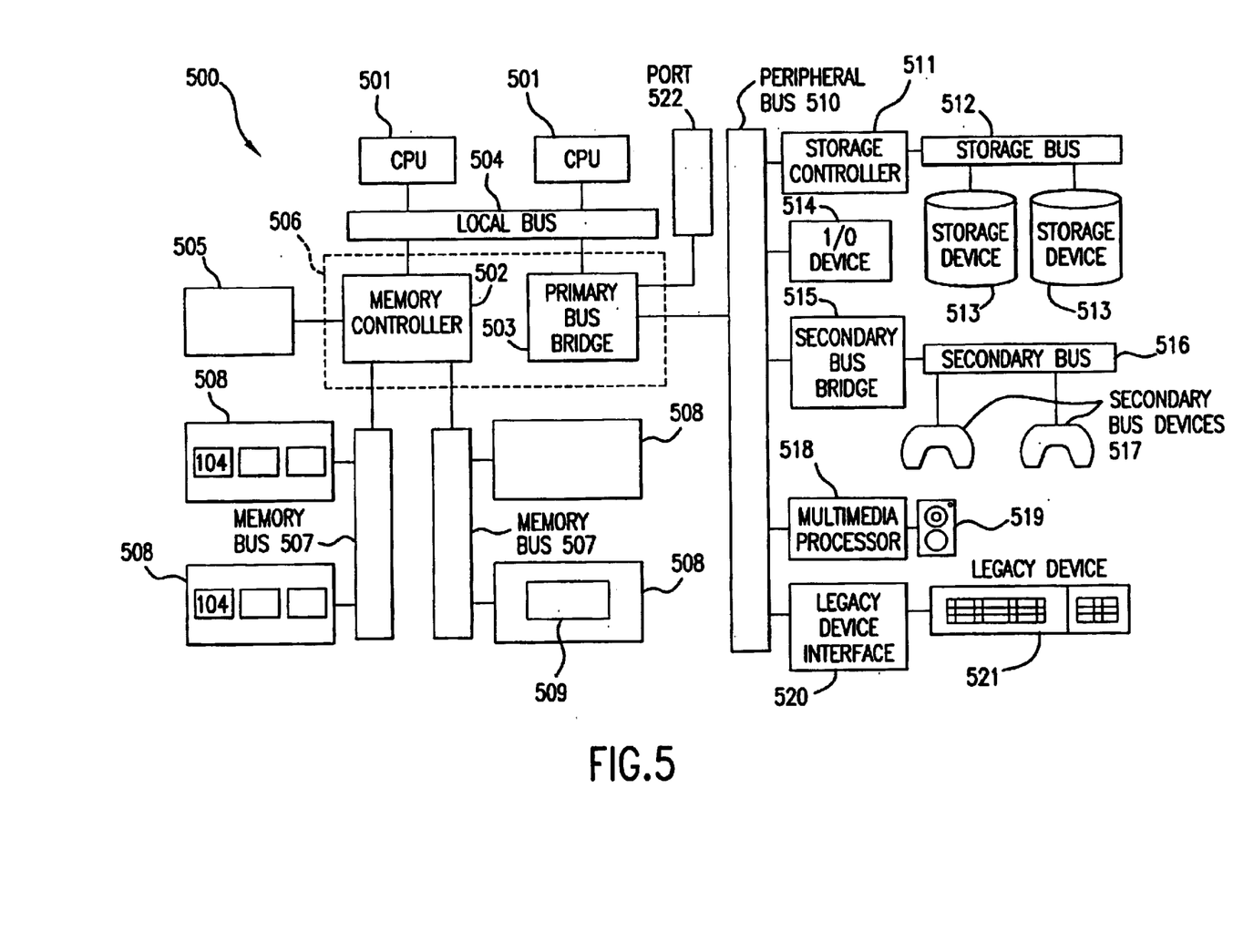
FIG. 5 is a schematic diagram of the present invention employed within a processor circuit.

FIG. 5 illustrates an exemplary processing system 500 which utilizes a CAM memory device 104 of the present invention. The processing system 500 includes one or more processors 501 coupled to a local bus 504. A memory controller 502 and a primary bus bridge 503 are also coupled the local bus 504. The processing system 500 may include multiple memory controllers 502 and/or multiple primary bus bridges 503. The memory controller 502 and the primary bus bridge 503 may be integrated as a single device 506.

The memory controller 502 is also coupled to one or more memory buses 507. Each memory bus accepts memory components 508. Any one or all of memory components 508 may contain a CAM array 104 in accordance with the present invention.

The memory components 508 may be a memory card or a memory module. The memory components 508 may include one or more additional devices 509. For example, in a SIMM or DIMM, the additional device 509 might be a configuration memory, such as a serial presence detect (SPD) memory. The memory controller 502 may also be coupled to a cache memory 505. The cache memory 505 may be the only cache memory in the processing system. Alternatively, other devices, for example, processors 501 may also include cache memories, which may form a cache hierarchy with cache memory 505. If the processing system 500 include peripherals or controllers which are bus masters or which support direct memory access (DMA), the memory controller 502 may implement a cache coherency protocol. If the memory controller 502 is coupled to a plurality of memory buses 507, each memory bus 507 may be operated in parallel, or different address ranges may be mapped to different memory buses 507.

The primary bus bridge 503 is coupled to at least one peripheral bus 510. Various devices, such as peripherals or additional bus bridges may be coupled to the peripheral bus 510. These devices may include a storage controller 511, an miscellaneous I/O device 514, a secondary bus bridge 515, a multimedia processor 518, and an legacy device interface 520. The primary bus bridge 503 may also coupled to one or more special purpose high speed ports 522. In a personal computer, for example, the special purpose port might be the Accelerated Graphics Port (AGP), used to couple a high performance video card to the processing system 500.

The storage controller 511 couples one or more storage devices 513, via a storage bus 512, to the peripheral bus 510. For example, the storage controller 511 may be a SCSI controller and storage devices 513 may be SCSI discs. The I/O device 514 may be any sort of peripheral. For example, the I/O device 514 may be an local area network interface, such as an Ethernet card. The secondary bus bridge may be used to interface additional devices via another bus to the processing system. For example, the secondary bus bridge may be an universal serial port (USB) controller used to couple USB devices 517 via to the processing system 500. The multimedia processor 518 may be a sound card, a video capture card, or any other type of media interface, which may also be coupled to one additional devices such as speakers 519. The legacy device interface 520 is used to couple legacy devices, for example, older styled keyboards and mice, to the processing system 500.

The processing system 500 illustrated in FIG. 5 is only an exemplary processing system with which the invention may be used. While FIG. 5 illustrates a processing architecture especially suitable for a general purpose computer, such as a personal computer or a workstation, it should be recognized that well known modifications can be made to configure the processing system 500 to become more suitable for use in a variety of applications. For example, many electronic devices which require processing may be implemented using a simpler architecture which relies on a CPU 501 coupled to memory components 508 and/or memory devices 509. The modifications may include, for example, elimination of unnecessary components, addition of specialized devices or circuits, and/or integration of a plurality of devices.

While the invention has been described and illustrated with reference to specific exemplary embodiments, it should be understood that many modifications and substitutions can be made without departing from the spirit and scope of the invention. For example, although dynamic CAM storage elements have been described as capacitors or as transistors functioning as capacitors, the invention can also be used with static storage elements for storing CAM data words. Accordingly, the invention is not to be considered as limited by the foregoing description but is only limited by the scope of the appended claims.

What is claimed as new and desired to be protected by letters patent of the United States is:

1. A content-addressable memory cell, comprising:
    a pair of storage elements, for storing data corresponding to a value of said memory cell;
    a pair of access transistors respectively connected between said storage elements and a pair of complementary bitlines, for reading, writing, and refreshing said memory cell; and
    a pair of logic transistors, respectively connected between a pair of complementary compare lines and a match line and having gates respectively coupled to said storage elements, said logic transistors performing a comparison of data on said complementary compare lines with data stored in said storage elements.

2. The memory cell of claim 1, wherein said complementary bitlines are used to perform a refresh operation independently of the use of said complementary compare lines to perform a compare operation.

3. The memory cell of claim 1, wherein said storage elements are transistors configured as capacitors.

4. The memory cell of claim 1, wherein said storage elements each store separate logic values so that each memory cell holds complementary data.

5. The memory cell of claim 1, further comprising:
    a conduction path, for pulling one of a plurality of match lines to ground through at least one of said complementary compare lines upon detection of a non-match between data on one of said pair of compare lines and respective data stored in one of said storage elements.

6. The memory cell of claim 4, wherein said complementary bitlines are used to refresh said storage elements.

7. A processor circuit, comprising
    a processor; and
    a memory device for exchanging data with said processor; said memory device comprising at least one memory cell the memory cell comprising:
    a pair of storage elements, for storing data corresponding to a value of said memory cell;
    a pair of access transistors respectively connected between said storage elements and a pair of complementary bitlines, for reading, writing, and refreshing said memory cell; and
    a pair of logic transistors, respectively connected between a pair of complementary compare lines and a match line and having gates respectively coupled to said storage elements, said logic transistors performing a comparison of data on said complementary compare lines with data stored in said storage elements.

8. The processor circuit of claim 7, wherein said complementary bitlines are used to perform a refresh operation independently of the use of said complementary compare lines to perform a compare operation.

9. The processor circuit of claim 7, wherein said storage elements are transistors configured as capacitors.

10. The processor circuit of claim 7, wherein said storage elements each stores separate logic values so that each memory cell holds complementary data.

11. The processor circuit of claim 7, further comprising:
    a conduction path, for pulling one of a plurality of match lines to ground through said complementary compare lines upon detection of a non-match between one of said pair of compare lines and a bit stored in one of said storage elements.

12. The processor circuit of claim 10, wherein said complementary bitlines are used to perform a refresh of said storage elements.

13. A content-addressable memory array, comprising:
a plurality of memory cells, at least some of said memory cells comprising:
a pair of storage elements, for storing data corresponding to a value of said memory cell;
a pair of access transistors, each respectively connected between one of said storage elements and a bitlines, for reading, writing, and refreshing said memory cell; and
a pair of logic transistors, each respectively connected between a compare line and a match line and having a gate respectively coupled to one of said storage elements, said logic transistors for performing a comparison of data on said compare line with data stored in one of said storage elements independently from performing a refresh of said storage element by said bitlines.

14. A content-addressable memory array, comprising:
a plurality of memory cells, at least some of said memory cells comprising:
a pair of storage elements, for storing data as one of two logic states or as a don't care state;
a pair of access transistors respectively connected between said storage elements and a pair of complementary bitlines, for reading, writing, and refreshing said memory cell;
a pair of logic transistors, respectively connected between a pair of complementary compare lines and a match line and having gates respectively coupled to said storage elements, said logic transistors performing a comparison of data on said complementary compare lines with data stored in said storage elements, at least one of said logic transistors pulling said match line to ground through at least one of said complementary compare lines upon detection of a non-match between data on said one compare line and data stored in one of said storage elements.

15. A method of operating a content-addressable memory cell, comprising:
storing data in a storage element;
comparing data present on a compare line with data stored in said storage element;
detecting a non-match between data on said compare line and data stored in said storage element; and
changing the state of a match line using said compare line when a non-match is detected.

16. The method of claim 15, further comprising:
refreshing said storage element using a bitline which is separate from said compare line.

17. The method of claim 15, wherein the step of changing the state of the match line comprises pulling said match line toward ground through a compare line when said non-match is detected.

18. The method of claim 15, wherein said storage element is a capacitor.

19. The method of claim 18, wherein said storage element is a transistor configured as a capacitor.

20. A method of operating a content addressable memory cell, comprising:
storing a logic state as data in a pair of storage elements;
comparing complementary data on a pair of compare lines with respective data stored in said pair of storage elements;
detecting a non-match between data on at least one of said compare lines with respective data stored in one of said storage elements; and
changing the state of a match line using said at least one compare line when a non-match is detected.

21. The method of claim 20, wherein said act of storing data comprises storing data representing one of two logic states in said pair of storage elements.

22. The method of claim 20, wherein said act of storing data comprises storing the same data representing a don't care state in said pair of storage elements.

23. The method of claim 20, wherein the act of changing the state of the match line comprises pulling the match line toward ground through a compare line when said non-match condition is detected.

24. A data router comprising:
a content addressable random access memory for storing routing information, said memory containing a plurality of memory cells, each comprising:
a pair of storage elements, for storing data corresponding to a value of said memory cell;
a pair of access transistors respectively connected between said storage elements and a pair of complementary bitlines, for reading, writing, and refreshing said memory cell; and
a pair of logic transistors, respectively connected between a pair of complementary compare lines and a match line and having gates respectively coupled to said storage elements, said logic transistors performing a comparison of data on said complementary compare lines with data stored in said storage elements.

25. The data router of claim 24, wherein said complementary bitlines are used to perform a refresh operation independently of the use of said complementary compare lines to perform a compare operation.

26. The data router of claim 24, wherein said storage elements are transistors configured as capacitors.

27. The data router of claim 24, wherein said storage elements each store separate logic values so that memory cell holds complementary data.

28. The data router of claim 24, further comprising a conduction path, for pulling one of a plurality of match lines to ground through at least one of said complementary compare lines upon detection of a non-match between data on one of said pair of compare lines and respective data stored in one storage elements.

29. The data router of claim 27, wherein said complementary bitlines are used to refresh said storage elements.

* * * * *

UNITED STATES PATENT AND TRADEMARK OFFICE
CERTIFICATE OF CORRECTION

PATENT NO. : 6,744,654 B2
DATED : June 1, 2004
INVENTOR(S) : Daniel R. Loughmiller It is certified that error appears in the above-identified patent and that said Letters Patent is hereby corrected as shown below:

Column 3,
Line 34, "thereto To" should read -- thereto. To --.

Column 4,
Lines 47-53, delete.

Column 5,
Line 11, "include" should read -- includes --.
Lines 22, 24, 35 and 39, "an" should read -- a --.
Line 25, "also coupled" should read -- also be coupled --.

Column 7,
Line 13, "bitlines" should read -- bitline --.

Signed and Sealed this

Twenty-fourth Day of January, 2006

JON W. DUDAS
*Director of the United States Patent and Trademark Office*